US011380820B2

(12) United States Patent
Noda et al.

(10) Patent No.: US 11,380,820 B2
(45) Date of Patent: Jul. 5, 2022

(54) LIGHT EMITTING DEVICE AND PROJECTOR

(71) Applicants: Seiko Epson Corporation, Tokyo (JP); Sophia School Corporation, Tokyo (JP)

(72) Inventors: Takafumi Noda, Matsumoto (JP); Katsumi Kishino, Akiruno (JP)

(73) Assignees: Seiko Epson Corporation; Sophia School Corporation

( * ) Notice: Subject to any disclaimer, the term of this patent is extended or adjusted under 35 U.S.C. 154(b) by 195 days.

(21) Appl. No.: 16/802,628

(22) Filed: Feb. 27, 2020

(65) Prior Publication Data

US 2020/0279974 A1 Sep. 3, 2020

(30) Foreign Application Priority Data

Feb. 28, 2019 (JP) .............................. JP2019-035580

(51) Int. Cl.
*H01L 33/24* (2010.01)
*H01L 33/18* (2010.01)
(Continued)

(52) U.S. Cl.
CPC .......... *H01L 33/24* (2013.01); *G03B 21/2013* (2013.01); *G03B 21/2033* (2013.01);
(Continued)

(58) Field of Classification Search
CPC ............ G03B 21/2013; G03B 21/2033; H01L 27/153; H01L 33/0012; H01L 33/06;
(Continued)

(56) References Cited

U.S. PATENT DOCUMENTS

| 2008/0093608 A1 | 4/2008 | Chik et al. |
| 2011/0169025 A1 | 7/2011 | Kishino et al. |

(Continued)

FOREIGN PATENT DOCUMENTS

| DE | 102010012711 A1 * | 9/2011 | ........... H01L 33/007 |
| EP | 3 159 932 A1 | 4/2017 | |

(Continued)

*Primary Examiner* — Matthew C Landau
*Assistant Examiner* — Dmitriy Yemelyanov
(74) *Attorney, Agent, or Firm* — Harness, Dickey & Pierce, P.L.C.

(57) ABSTRACT

In a light emitting device, a columnar part includes a first semiconductor layer, a second semiconductor layer different in conductivity type from the first semiconductor layer, and a light emitting layer disposed between the first semiconductor layer and the second semiconductor layer, the first semiconductor layer is disposed between the substrate and the light emitting layer, the light emitting layer includes a first layer, and a second layer larger in bandgap than the first layer, the first semiconductor layer has a facet plane, the first layer has a facet plane, the facet plane of the first semiconductor layer is provided with the first layer, and $\theta 2 > \theta 1$, in which $\theta 1$ is a tilt angle of the facet plane of the first semiconductor layer with respect to a surface of the substrate provided with the laminated structure, and $\theta 2$ is a tilt angle of the facet plane of the first layer provided to the facet plane of the first semiconductor layer with respect to the surface of the substrate.

5 Claims, 5 Drawing Sheets

(51) Int. Cl.
*H01L 27/15* (2006.01)
*G03B 21/20* (2006.01)
*H01L 33/40* (2010.01)
*H01L 33/32* (2010.01)
*H01L 33/06* (2010.01)
*H01L 33/00* (2010.01)
*H01L 33/44* (2010.01)
*H01L 33/12* (2010.01)

(52) U.S. Cl.
CPC ............ *H01L 27/153* (2013.01); *H01L 33/18* (2013.01); *H01L 33/0012* (2013.01); *H01L 33/06* (2013.01); *H01L 33/12* (2013.01); *H01L 33/325* (2013.01); *H01L 33/40* (2013.01); *H01L 33/44* (2013.01)

(58) Field of Classification Search
CPC ......... H01L 33/08; H01L 33/12; H01L 33/18; H01L 33/24; H01L 33/325; H01L 33/40; H01L 33/04
See application file for complete search history.

(56) References Cited

U.S. PATENT DOCUMENTS

| | | | |
|---|---|---|---|
| 2013/0140521 A1* | 6/2013 | Gilet | H01L 33/24 257/13 |
| 2016/0064608 A1* | 3/2016 | Chung | H01L 33/24 257/13 |

FOREIGN PATENT DOCUMENTS

| | | |
|---|---|---|
| JP | 2004-241366 A | 8/2004 |
| JP | 2004-296950 A | 10/2004 |
| JP | 2009-522754 A | 6/2009 |
| JP | 2013-239718 A | 11/2013 |
| JP | 2016-009702 A | 1/2016 |

* cited by examiner

LIGHT EMITTING DEVICE AND PROJECTOR

The present application is based on, and claims priority from, JP Application Serial Number 2019-035580, filed Feb. 28, 2019, the disclosure of which is hereby incorporated by reference herein in its entirety.

BACKGROUND

1. Technical Field

The present disclosure relates to a light emitting device and a projector.

2. Related Art

A semiconductor laser is promising as a high-luminance next-generation light source. In particular, the semiconductor laser having a nano-structure called a nano-column, a nano-wire, a nano-rod, a nano-pillar, or the like is expected to realize a light emitting device capable of obtaining narrow radiation angle and high power light emission due to an effect of a photonic crystal.

For example, in JP-A-2013-239718 (Document 1), there is disclosed a semiconductor photonic element array, the emission wavelength or the photoabsorption wavelength of which is controlled by controlling the position and the shape of a microcrystalline prismatic crystal. For example, in Document 1, there is disclosed a light emitting element including nano-columns formed of an n-type semiconductor layer as the microcrystalline prismatic crystal, an active layer disposed on the n-type semiconductor layer, and a p-type semiconductor layer disposed on the active layer.

In Document 1, the microcrystalline prismatic crystal has a facet structure in a tip portion. In other words, the microcrystalline prismatic crystal has a shape with a sharp tip portion. Further, the active layer also has a shape with a sharp tip portion. Therefore, in a boundary portion between the n-type semiconductor layer and the active layer, and a boundary portion between the active layer and the p-type semiconductor layer, the electrical field is concentrated into the sharp portion. As a result, the current density locally rises in the active layer, and it is unachievable to efficiently inject the electrical current into the active layer.

SUMMARY

A light emitting device according to an aspect of the present disclosure includes a substrate, and a laminated structure provided to the substrate, and including a plurality of columnar parts, wherein the columnar part includes a first semiconductor layer, a second semiconductor layer different in conductivity type from the first semiconductor layer, and a light emitting layer disposed between the first semiconductor layer and the second semiconductor layer, the first semiconductor layer is disposed between the substrate and the light emitting layer, the light emitting layer includes a first layer, and a second layer larger in bandgap than the first layer, the first semiconductor layer has a facet plane, the first layer has a facet plane, the facet plane of the first semiconductor layer is provided with the first layer, and $\theta 2 > \theta 1$, in which $\theta 1$ is a tilt angle of the facet plane of the first semiconductor layer with respect to a surface of the substrate provided with the laminated structure, and $\theta 2$ is a tilt angle of the facet plane of the first layer provided to the facet plane of the first semiconductor layer with respect to the surface of the substrate.

In the light emitting device according to the aspect of the present disclosure, the first layer may include a first portion, and a second portion larger in bandgap than the first portion.

In the light emitting device according to the aspect of the present disclosure, the first semiconductor layer may have a c-plane, and the first layer may have a c-plane.

In the light emitting device according to the aspect of the present disclosure, in a plan view viewed in a stacking direction of the laminated structure, the c-plane of the first semiconductor layer may be larger than the facet plane of the first semiconductor layer.

In the light emitting device according to the aspect of the present disclosure, in a plan view viewed in a stacking direction of the laminated structure, the c-plane of the first layer may be larger than the facet plane of the first layer.

A light emitting device according to another aspect of the present disclosure includes a substrate, and a laminated structure provided to the substrate, and including a plurality of columnar parts, wherein the columnar part includes a first semiconductor layer, a second semiconductor layer different in conductivity type from the first semiconductor layer, and a light emitting layer disposed between the first semiconductor layer and the second semiconductor layer, the first semiconductor layer is disposed between the substrate and the light emitting layer, the second semiconductor layer includes a third semiconductor layer, and a fourth semiconductor layer lower in impurity concentration than the third semiconductor layer, the light emitting layer has a facet plane, the fourth semiconductor layer has a facet plane, the facet plane of the light emitting layer is provided with the fourth semiconductor layer, and $\theta 4 > \theta 3$, in which $\theta 3$ is a tilt angle of the facet plane of the light emitting layer with respect to a surface of the substrate provided with the laminated structure, and $\theta 4$ is a tilt angle of the facet plane of the fourth semiconductor layer provided to the facet plane of the light emitting layer with respect to the surface of the substrate.

In the light emitting device according to the aspect of the present disclosure, the light emitting layer may have a c-plane, and the fourth semiconductor layer may have a c-plane.

In the light emitting device according to the aspect of the present disclosure, in a plan view viewed in a stacking direction of the laminated structure, the c-plane of the light emitting layer may be larger than the facet plane of the light emitting layer.

In the light emitting device according to the aspect of the present disclosure, in a plan view viewed in a stacking direction of the laminated structure, the c-plane of the fourth semiconductor layer may be larger than the facet plane of the fourth semiconductor layer.

A projector according to another aspect of the present disclosure includes the light emitting device according to one of the above aspects.

DESCRIPTION OF EXEMPLARY EMBODIMENTS

Some preferred embodiments of the present disclosure will hereinafter be described in detail using the drawings. It should be noted that the embodiments described below do not unreasonably limit the contents of the present disclosure as set forth in the appended claims. Further, all of the constituents described hereinafter are not necessarily essential elements of the present disclosure.

1. First Embodiment

Figure 1:
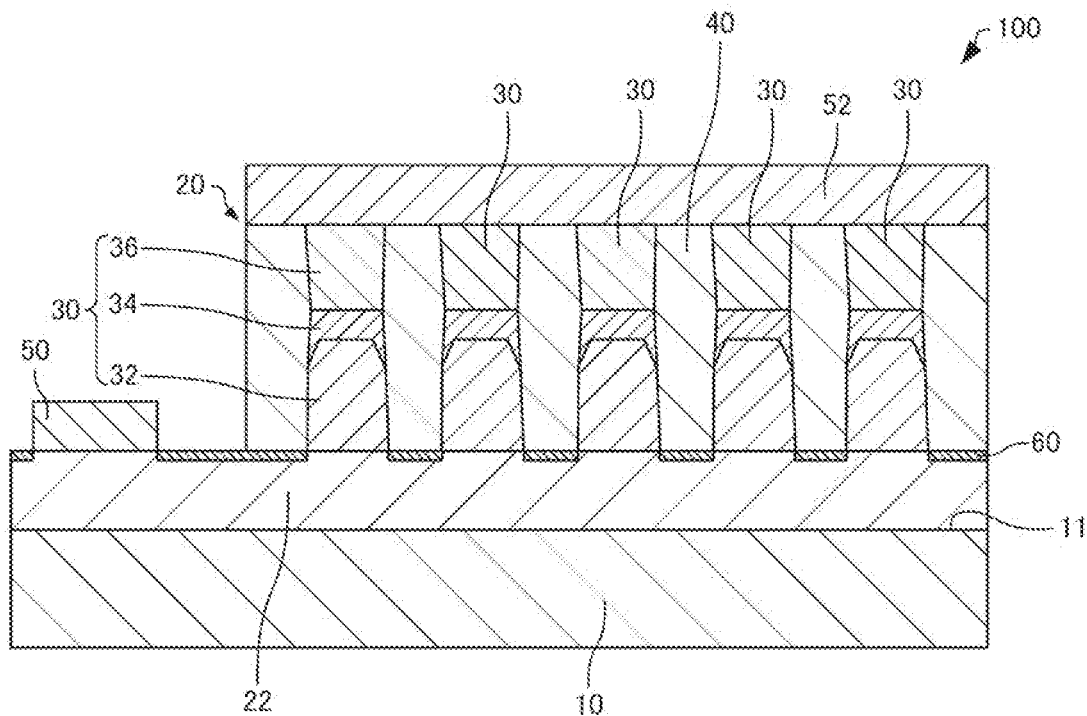
FIG. 1 is a cross-sectional view schematically showing a light emitting device according to a first embodiment.

Firstly, a light emitting device according to a first embodiment will be described with reference to the drawings. FIG. 1 is a cross-sectional view schematically showing the light emitting device 100 according to the first embodiment.

As shown in FIG. 1, the light emitting device 100 includes a substrate 10, a laminated structure 20, a first electrode 50, and a second electrode 52.

The substrate 10 has, for example, a plate-like shape. The substrate 10 is, for example, a silicon (Si) substrate, a gallium nitride (GaN) substrate, or a sapphire substrate.

The laminated structure 20 is provided to the substrate 10. In the illustrated example, the laminated structure 20 is disposed on the substrate 10. The laminated structure 20 is provided to a principal surface 11 of the substrate 10. The principal surface 11 of the substrate 10 is an upper surface of the substrate 10 in the illustrated example. The laminated structure 20 has, for example, a buffer layer 22, a plurality of columnar parts 30, and an insulating layer 40.

It should be noted that in the present disclosure, "up" denotes a direction of getting away from the substrate 10 viewed from a light emitting layer 34 of the columnar part 30 in a stacking direction of the laminated structure (hereinafter also referred to simply as a "stacking direction"), and "down" denotes a direction of getting closer to the substrate 10 viewed from the light emitting layer 34 in the stacking direction. In the present disclosure, the "stacking direction of the laminated structure 20" denotes a stacking direction of a first semiconductor layer 32 and the light emitting layer 34 of the columnar part 30.

The buffer layer 22 is disposed on the substrate 10. The buffer layer 22 is provided to the principal surface 11 of the substrate 10. The buffer layer 22 is, for example, an Si-doped n-type GaN layer. On the buffer layer 22, there is disposed a mask layer 60 for forming the columnar parts 30. The mask layer 60 is, for example, a titanium layer, a titanium oxide layer, a silicon oxide layer, or an aluminum oxide layer.

The columnar parts 30 are disposed on the buffer layer 22. The planar shape of each of the columnar parts 30 viewed from the stacking direction is, for example, a polygonal shape or a circular shape. The diametrical size of the columnar part 30 is in a nanometer-order range, and is, for example, no smaller than 10 nm and no larger than 500 nm. The columnar part 30 is also called a nano-column, a nano-wire, a nano-rod or a nano-pillar. The size in the stacking direction of the columnar part 30 is, for example, no smaller than 0.1 μm and no larger than 5 μm.

In the present disclosure, when the planar shape viewed from the stacking direction of the columnar part 30 is a circle, the "diametrical size" denotes the diameter of the circle, and when the planar shape of the columnar part 30 is not a circular shape, the "diametrical size" denotes the diameter of the minimum encompassing circle. For example, when the planar shape of the columnar part 30 is a polygonal shape, the minimum encompassing circle is the minimum circle including the polygonal shape inside, and when the planar shape of the columnar shape 30 is an ellipse, the minimum encompassing circle is the minimum circle including the ellipse inside.

The number of the columnar parts 30 disposed is more than one. An interval between the columnar parts 30 adjacent to each other is, for example, no smaller than 1 nm and no larger than 500 nm. The plurality of columnar parts 30 is arranged at a predetermined pitch in a predetermined direction in a plan view viewed from the stacking direction. The plurality of columnar parts 30 is disposed so as to form, for example, a triangular grid or a quadrangular grid in the plan view viewed from the stacking direction. The plurality of columnar parts 30 can develop an effect of a photonic crystal. The columnar parts 30 each have the first semiconductor layer 32, the light emitting layer 34, and a second semiconductor layer 36.

The first semiconductor layer 32 is disposed on the buffer layer 22. The first semiconductor layer 32 is disposed between the substrate 10 and the light emitting layer 34. The first semiconductor layer 32 is, for example, an n-type semiconductor layer including gallium nitride. The first semiconductor layer 32 is, for example, a silicon doped n-type GaN layer.

The light emitting layer 34 is disposed on the first semiconductor layer 32. The light emitting layer 34 is disposed between the first semiconductor layer 32 and the second semiconductor layers 36. The light emitting layer 34 is an i-type semiconductor layer doped with no impurity. The light emitting layer 34 has a multiple quantum well (MQW) structure.

The second semiconductor layer 36 is disposed on the light emitting layer 34. The second semiconductor layer 36 is a layer different in conductivity type from the first semiconductor layer 32. The second semiconductor layer 36 is, for example, a p-type semiconductor layer including gallium nitride. The second semiconductor layer 36 is, for example, a magnesium (Mg) doped p-type GaN layer. The first semiconductor layer 32 and the second semiconductor layer 36 are cladding layers having a function of confining the light in the light emitting layer 34.

It should be noted that in FIG. 1, the columnar parts 30 are illustrated in a simplified manner. The details of the structure of the columnar part 30 will be described later.

The insulating layer 40 is disposed between the columnar parts 30 adjacent to each other. The insulating layer 40 is disposed on the mask layer 60. The insulating layer 40 covers a side surface of the columnar part 30. In other words, the insulating layer 40 covers a side surface of the first semiconductor layer 32, a side surface of the light emitting layer 34, and a side surface of the second semiconductor layer 36. The refractive index of the insulating layer 40 is lower than the refractive index of the columnar parts 30. For example, the refractive index of the insulating layer 40 is lower than the refractive index of the first semiconductor layer 32, the refractive index of the light emitting layer 34, and the refractive index of the second semiconductor layer 36. The insulating layer 40 is, for example, an i-type semiconductor layer including gallium nitride. The insulating layer 40 is, for example, a GaN layer doped with no impurity.

The insulating layer 40 functions as a light propagation layer for propagating the light generated in the light emitting layer 34. Further, the insulating layer 40 also functions as a protective film for preventing non-emission recombination on the side surface of the light emitting layer 34. It should be noted that the insulating layer 40 is not limited to the GaN layer, but can also be another insulating layer such as an AlGaN layer providing the insulating layer has a function as the light propagation layer and the protective layer.

The first electrode 50 is disposed on the buffer layer 22. It is also possible for the buffer layer 22 to have ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one of the electrodes for injecting the current into the light emitting layer 34. As the first electrode 50, there is used, for example, what is obtained by stacking a Ti layer, an Al layer, and an Au layer in this order from the buffer layer 22 side. It should be noted that when the substrate 10 has electrical conductivity, it is also possible for the first electrode 50 to be disposed below the substrate 10 although not shown in the drawings.

The second electrode 52 is disposed on the opposite side to the substrate 10 of the laminated structure 20. In the illustrated example, the second electrode 52 is disposed on the second semiconductor layer 36. It is also possible for the second semiconductor layer 36 to have ohmic contact with the second electrode 52. The second electrode 52 is electrically coupled to the second semiconductor layer 36. The second electrode 52 is the other of the electrodes for injecting the current into the light emitting layer 34. As the second electrode 52, there is used, for example, indium tin oxide (ITO).

In the light emitting device 100, a pin diode is constituted by the p-type second semiconductor layer 36, the light emitting layer 34, and the n-type first semiconductor layer 32. In the light emitting device 100, when applying a forward bias voltage of the pin diode between the first electrode 50 and the second electrode 52, an electrical current is injected into the light emitting layer 34, and recombination of electrons and holes occurs in the light emitting layer 34. The recombination causes light emission. The light generated in the light emitting layer 34 propagates in a direction perpendicular to the stacking direction through the insulating layer 40 due to the first semiconductor layer 32 and the second semiconductor layer 36 to form a standing wave due to the effect of the photonic crystal caused by the plurality of columnar parts 30, and then causes laser oscillation with a gain in the light emitting layer 34. Then, the light emitting device 100 emits positive first-order diffracted light and negative first-order diffracted light as a laser beam in the stacking direction.

It should be noted that although not shown in the drawings, it is also possible to dispose a reflecting layer between the substrate 10 and the buffer layer 22, or below the substrate 10. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the second electrode 52 side.

Figure 2:
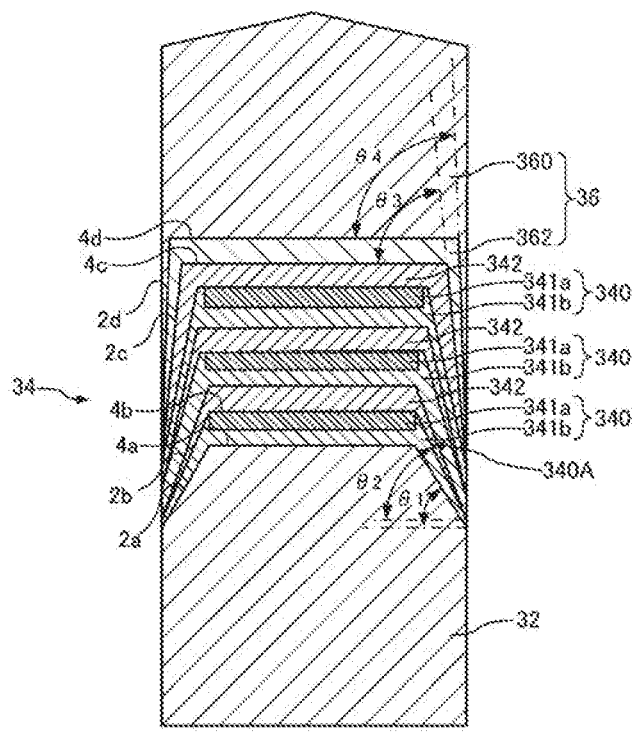
FIG. 2 is a cross-sectional view schematically showing a columnar part of the light emitting device according to the first embodiment.

FIG. 2 is a cross-sectional view schematically showing the columnar part 30.

The light emitting layer 34 has first layers 340 and second layers 342. The light emitting layer 34 has the MQW structure having the first layers 340 and the second layers 342 arranged alternately. In the illustrated example, the light emitting layer 34 has the MQW structure obtained by stacking three quantum well structures each formed of the first layer 340 and the second layer 342.

The first layer 340 is, for example, an i-type InGaN layer doped with no impurity. The first layer 340 is a well in the quantum well structure. The first layer 340 has a first portion 341a and a second portion 341b.

The concentration of indium (In) in the first portion 341a is higher than the concentration of indium in the second portion 341b. The bandbap of the second portion 341b is larger than the bandgap of the first portion 341a. The first portion 341a overlaps a c-plane 4a of the first semiconductor layer 32 when viewed from the stacking direction. When viewed from the stacking direction, the first portion 341a is located in a central part of the columnar part 30, and the second portion 341b surrounds the first portion 341a.

The second layer 342 is, for example, an i-type GaN layer doped with no impurity. It should be noted that the second layer 342 can be an i-type InGaN layer. On this occasion, the concentration of indium in the second layer 342 is lower than the concentration of indium in the first layer 340. The second layer 342 is a barrier in the quantum well structure. The bandbap of the second layer 342 is larger than the bandgap of the first layer 340.

The second semiconductor layer 36 a third semiconductor layer 360 and a fourth semiconductor layer 362. The fourth semiconductor layer 362 is disposed on the light emitting layer 34. The third semiconductor layer 360 is disposed on the fourth semiconductor layer 362. The fourth semiconductor layer 362 is disposed between the light emitting layer 34 and the third semiconductor layers 360. The impurity concentration of the fourth semiconductor layer 362 is lower than the impurity concentration of the third semiconductor layer 360. The impurity concentration of the fourth semiconductor layer 362 is in a range of, for example, about $1\times10^{18}$ through $3\times10^{19}$ cm$^{-3}$. The impurity concentration of the third semiconductor layer 360 is in a range of, for example, about $1\times10^{19}$ through $1\times10^{20}$ cm$^{-3}$. The hole-carrier concentration of the fourth semiconductor layer 362 is lower than the hole-carrier concentration of the third semiconductor layer 360.

A boundary portion between the first semiconductor layer 32 and the light emitting layer 34 in the light emitting device 100 will be described.

In the boundary portion between the first semiconductor layer 32 and the light emitting layer 34, the first layer 340 as the lowermost layer (hereinafter also referred to as a "first layer 340A") out of the layers constituting the light emitting layer 34 and the first semiconductor layer 32 have contact with each other.

The tip part of the first semiconductor layer 32 is shaped like, for example, a truncated polygonal pyramid, or a circular truncated cone. The first semiconductor layer 32 is, for example, a GaN crystal having a wurtzite crystal structure. As shown in FIG. 2, the first semiconductor layer 32 has facet planes 2a and the c-plane 4a. The c-plane 4a is a plane parallel to the principal surface 11 of the substrate 10 shown in FIG. 1. The facet planes 2a are each a plane tilted with respect to the principal surface 11 of the substrate 10. In other words, the facet planes 2a are tilted with respect to the c-plane 4a. The c-plane 4a is a (0001) plane, and the facet planes 2a are, for example, a (1-101) plane, a (11-22) plane, and so on.

The facet planes 2a and the c-plane 4a of the first semiconductor layer 32 are provided with the first layer 340A. The first layer 340 is a layer formed by growing the InGaN layer epitaxially on the first semiconductor layer 32. Therefore, the first layer 340 has facet planes 2b and a c-plane 4b similarly to the first semiconductor layer 32. The c-plane 4b is a plane parallel to the principal surface 11 of the substrate 10 shown in FIG. 1. The facet planes 2b are each a plane tilted with respect to the principal surface 11 of the substrate 10.

As shown in FIG. 2, the tilt angle of the facet plane 2a of the first semiconductor layer 32 with respect to the principal surface 11 of the substrate 10 is denoted by $\theta 1$. Further, the tilt angle of the facet plane 2b of the first layer 340A with respect to the principal surface 11 of the substrate 10 is denoted by $\theta 2$. In this case, $\theta 2 > \theta 1$ is true. Therefore, the film thickness of the first layer 340A in the central part of the columnar part 30 becomes larger than the film thickness of the first layer 340A in an outer peripheral part of the columnar part 30. In the illustrated example, in the first layer 340A, the film thickness in the central part of the columnar part 30 is constant, and the film thickness in the outer peripheral part of the columnar part 30 decreases in a direction of getting away from the central part of the columnar part 30.

Then, a boundary portion between the light emitting layer 34 and the second semiconductor layer 36 in the light emitting device 100 will be described.

In the boundary portion between the light emitting layer 34 and the second semiconductor layer 36, the light emitting layer 34 and the fourth semiconductor layer 362 have contact with each other.

As shown in FIG. 2, the light emitting layer 34 has facet planes 2c and the c-plane 4c. The facet planes 2c and the c-plane 4c of the light emitting layer 34 are surfaces of the second layer 342 as the uppermost layer out of the layers constituting the light emitting layer 34. The c-plane 4c is a plane parallel to the principal surface 11 of the substrate 10 shown in FIG. 1. The facet planes 2c are each a plane tilted with respect to the principal surface 11 of the substrate 10.

The facet planes 2c and the c-plane 4c of the light emitting layer 34 are provided with the fourth semiconductor layer 362. The fourth semiconductor layer 362 is a layer formed by growing the p-type GaN layer epitaxially on the light emitting layer 34. Therefore, the fourth semiconductor layer 362 has facet planes 2d and a c-plane 4d similarly to the light emitting layer 34. The c-plane 4d is a plane parallel to the principal surface 11 of the substrate 10 shown in FIG. 1. The facet planes 2d are each a plane tilted with respect to the principal surface 11 of the substrate 10.

As shown in FIG. 2, the tilt angle of the facet plane 2c of the light emitting layer 34 with respect to the principal surface 11 of the substrate 10 is denoted by $\theta 3$. Further, the tilt angle of the facet plane 2d of the fourth semiconductor layer 362 with respect to the principal surface 11 of the substrate 10 is denoted by $\theta 4$. In this case, $\theta 4 > \theta 3$ is true. Therefore, the film thickness of the fourth semiconductor layer 362 in the central part of the columnar part 30 becomes larger than the film thickness of the fourth semiconductor layer 362 in an outer peripheral part of the columnar part 30. In the illustrated example, in the fourth semiconductor layer 362, the film thickness in the central part of the columnar part 30 is constant, and the film thickness in the outer peripheral part of the columnar part 30 decreases in a direction of getting away from the central part of the columnar part 30.

Figure 3:
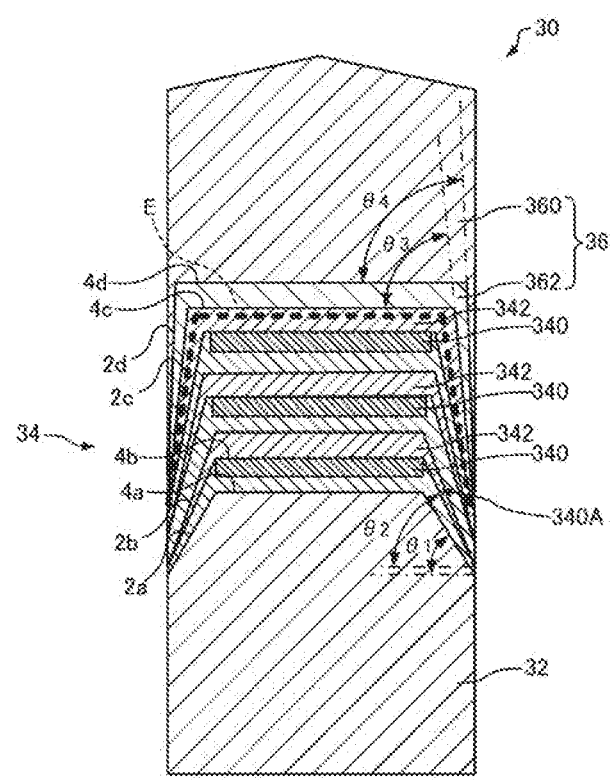
FIG. 3 is a diagram for explaining the condition of an electrical field in the columnar part of the light emitting device according to the first embodiment.
Figure 4:
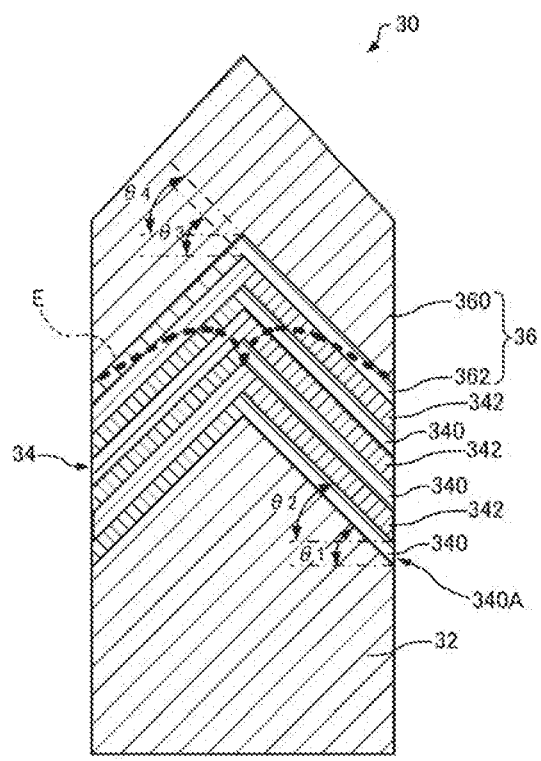
FIG. 4 is a diagram for explaining the condition of an electrical field in a columnar part of a light emitting device according to a reference example.

FIG. 3 is a diagram for explaining the condition of an electrical field in the columnar part 30 of the light emitting device 100. FIG. 4 is a diagram for explaining the condition of an electrical field in a columnar part of a light emitting device according to a reference example. It should be noted that in the reference example, $\theta 4 = \theta 3$ is true, and $\theta 1 = \theta 2$ is true. In FIG. 3 and FIG. 4, an equipotential line E of the electrical field is represented by the dotted lines.

In the reference example shown in FIG. 4, the tilt angle $\theta 3$ of the facet plane of the light emitting layer 34 and the tilt angle $\theta 4$ of the facet plane of the fourth semiconductor layer 362 are equal to each other ($\theta 3 = \theta 4$). Therefore, the film thickness of the fourth semiconductor layer 362 is constant. Therefore, the electrical field is concentrated in a portion with a sharp tip of the light emitting layer 34, namely in the central part of the columnar part 30. Thus, in the light emitting layer 34, the junction withstanding voltage of the central part of the columnar part 30 drops in the light emitting layer 34, and thus, the current density rises locally. As a result, it is not possible to efficiently inject the current into the light emitting layer 34.

In contrast, in the light emitting device 100, as shown in FIG. 3, the tilt angle $\theta 4$ of the facet plane 2d of the fourth semiconductor layer 362 is larger than the tilt angle $\theta 3$ of the facet plane 2c of the light emitting layer 34 ($\theta 4 > \theta 3$). Therefore, the film thickness of the fourth semiconductor layer 362 becomes large in the central part of the columnar part 30, and the film thickness of the fourth semiconductor layer 362 becomes small in the outer peripheral part of the columnar part 30. Therefore, it is possible to relax the electrical field concentration in the light emitting layer 34 compared to the case of $\theta 3 = \theta 4$. Thus, in the boundary portion between the second semiconductor layer 36 and the light emitting layer 34, the electrical current is gently narrowed, and it is possible to prevent the current density from locally increasing. As a result, it is possible to efficiently inject the current into the light emitting layer 34.

Further, in the light emitting device 100, the light emitting layer 34 has the c-plane 4c, and the fourth semiconductor layer 362 has the c-plane 4d. Therefore, it is possible to relax the electrical field concentration in the light emitting layer 34 compared to when the light emitting layer 34 and the fourth semiconductor layer 362 do not have the c-plane. For example, as shown in FIG. 4, when the light emitting layer 34 and the fourth semiconductor layer 362 do not have the c-plane, since the tip part of the light emitting layer 34 forms a sharp shape, the electrical field is concentrated. Since the light emitting layer 34 and the fourth semiconductor layer 362 have the c-plane 4c, the tip part of the light emitting layer 34 forms the c-plane, and therefore, it is possible to relax the electrical field concentration.

Although the boundary portion between the light emitting layer 34 and the second semiconductor layer 36 is described in the above description, substantially the same also applies to the boundary portion between the first semiconductor layer 32 and the light emitting layer 34. In other words, in the light emitting device 100, by making θ2>θ1 true, the film thickness of the first layer 340 becomes large in the central part of the columnar part 30, and the film thickness of the first layer 340 becomes small in the outer peripheral part of the columnar part 30. Therefore, the electrical field concentration can be relaxed in the light emitting layer 34. Thus, in the boundary portion between the first semiconductor layer 32 and the light emitting layer 34, the electrical current gently spreads, and it is possible to prevent the current density from locally increasing.

Further, in the light emitting device 100, the first semiconductor layer 32 has the c-plane 4a, and the first layer 340A has the c-plane 4b. Therefore, it is possible to relax the electrical field concentration in the light emitting layer 34 compared to when the first semiconductor layer 32 and the first layer 340A do not have the c-plane.

As described above, in the light emitting device 100, the current flowing through the columnar part 30 is gently narrowed in the boundary portion between the second semiconductor layer 36 and the light emitting layer 34, flows through the first portion 341a high in indium concentration in the light emitting layer 34, and then gently spreads in the boundary portion between the first semiconductor layer 32 and the light emitting layer 34. As described above, in the light emitting device 100, the pathway of the electrical current becomes an ideal pathway.

The light emitting device 100 has, for example, the following features.

In the light emitting device 100, when denoting the tilt angle of the facet plane 2a of the first semiconductor layer 32 by θ1, and denoting the tilt angle of the facet plane 2b of the first layer 340A disposed on the facet plane 2a of the first semiconductor layer 32 by θ2, θ2>θ1 is fulfilled. Therefore, in the light emitting device 100, it is possible to relax the electrical field concentration in the light emitting layer 34 compared to the case of θ1=θ2. Thus, it is possible to efficiently inject the current into the light emitting layer 34.

In the light emitting device 100, when denoting the tilt angle of the facet plane 2c of the light emitting layer 34 by θ3, and denoting the tilt angle of the facet plane 2d of the fourth semiconductor layer 362 disposed on the facet plane 2c of the light emitting layer 34 by θ4, θ4>θ3 is fulfilled. Therefore, in the light emitting device 100, it is possible to relax the electrical field concentration in the light emitting layer 34 compared to the case of θ3=θ4. Thus, it is possible to efficiently inject the current into the light emitting layer 34.

In the light emitting device 100, the first layer 340 has the first portion 341a and the second portion 341b larger in bandgap than the first portion 341a. In the light emitting device 100, it is possible to relax the electrical field concentration in the light emitting layer 34 as described above, it is possible to efficiently inject the current into the first portion 341a of the first layer 340.

In the light emitting device 100, the first semiconductor layer 32 has the c-plane 4a. The first layer 340A of the light emitting layer 34 has the c-plane 4b. Therefore, in the light emitting device 100, it is possible to relax the electrical field concentration in the light emitting layer 34 compared to when the first semiconductor layer 32 and the first layer 340A do not have the c-plane.

In the light emitting device 100, the light emitting layer 34 has the c-plane 4c, and the fourth semiconductor layer 362 has the c-plane 4d. Therefore, it is possible to relax the electrical field concentration in the light emitting layer 34 compared to when the light emitting layer 34 and the fourth semiconductor layer 362 do not have the c-plane.

In the plan view viewed from the stacking direction, the c-plane 4a of the first semiconductor layer is larger than the facet planes 2a of the first semiconductor layer 32. The size of the c-plane 4a in the plan view viewed from the stacking direction is the area of the c-plane 4a. Further, the size of the facet plane 2a in the plan view viewed from the stacking direction is represented by S1×cos θ1 when denoting the area of the facet plane 2a by S1.

In the plan view viewed from the stacking direction, the c-plane 4b of the first layer 340A is larger than the facet planes 2b of the first layer 340A. The size of the c-plane 4b in the plan view viewed from the stacking direction is the area of the c-plane 4b. Further, the size of the facet plane 2b in the plan view viewed from the stacking direction is represented by S2×cos θ2 when denoting the area of the facet plane 2b by S2.

In the plan view viewed from the stacking direction, the c-plane 4c of the light emitting layer 34 is larger than the facet planes 2c of the light emitting layer 34. The size of the c-plane 4c in the plan view viewed from the stacking direction is the area of the c-plane 4c. Further, the size of the facet plane 2c in the plan view viewed from the stacking direction is represented by S3×cos θ3 when denoting the area of the facet plane 2c by S3.

In the plan view viewed from the stacking direction, the c-plane 4d of the fourth semiconductor layer 362 is larger than the facet planes 2d of the fourth semiconductor layer 362. The size of the c-plane 4d in the plan view viewed from the stacking direction is the area of the c-plane 4d. Further, the size of the facet plane 2d in the plan view viewed from the stacking direction is represented by S4×cos θ4 when denoting the area of the facet plane 2d by S4.

1.2. Method of Manufacturing Light Emitting Device

Figure 5:
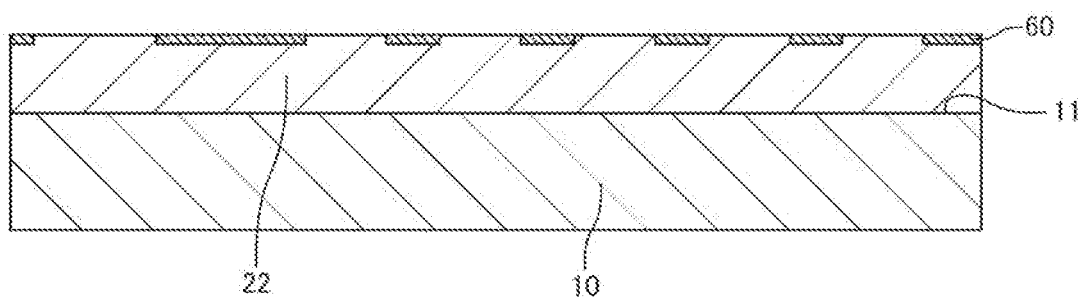
FIG. 5 is a cross-sectional view schematically showing a manufacturing process of the light emitting device according to the first embodiment.
Figure 6:
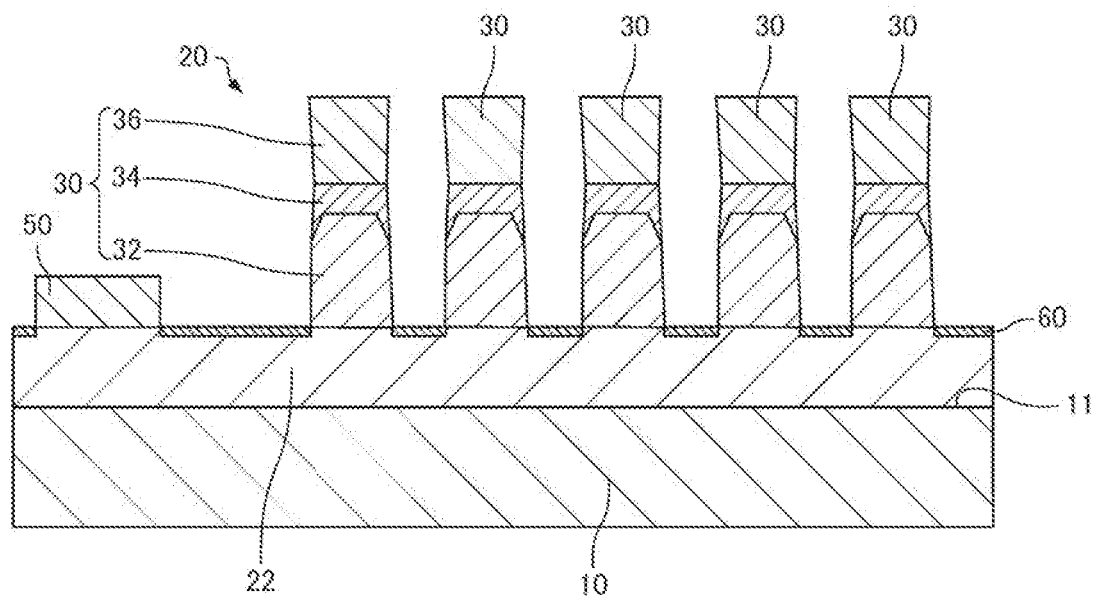
FIG. 6 is a cross-sectional view schematically showing the manufacturing process of the light emitting device according to the first embodiment.

Then, a method of manufacturing the light emitting device 100 will be described with reference to the drawings. FIG. 5 and FIG. 6 are cross-sectional views schematically showing the manufacturing process of the light emitting device 100.

As shown in FIG. 5, the buffer layer 22 is grown epitaxially on the substrate 10. As the method of growing the layer epitaxially, there can be cited, for example, an MOCVD (Metal Organic Chemical Vapor Deposition) method and an MBE (Molecular Beam Epitaxy) method.

Then, the mask layer 60 is formed on the buffer layer 22. The mask layer 60 is formed by deposition using an electron beam deposition method or a plasma chemical vapor deposition (CVD) method, and patterning with a photolithography technique and an etching technique.

As shown in FIG. 6, the first semiconductor layer 32 is grown epitaxially on the buffer layer 22 using the mask layer 60 as a mask.

Then, the light emitting layer 34 is grown epitaxially on the first semiconductor layer 32. As the method of growing the layers epitaxially, there can be cited, for example, the MOCVD method and the MBE method. In the present process, firstly, indium, gallium, and nitrogen are supplied to grow the first layer 340 epitaxially on the first semiconductor layer 32 as shown in FIG. 2. Then, gallium and nitrogen are supplied to grow the second layer 342 epitaxially on the first layer 340. On this occasion, by controlling the amounts of gallium and nitrogen supplied, the growth temperature, and so on, it is possible to epitaxially grow the first layer 340 so as to fulfill θ2>θ1. In particular, when epitaxially growing the first layer 340 using the MOCVD method, by controlling the gas pressure, it is possible to epitaxially grow the first layer 340 so as to fulfill θ2>θ1. Further, in the present process, the first portion 341a and the second portion 341b are formed in the first layer 340 due to the migration of In.

Then, indium, gallium, and nitrogen are supplied to thereby grow the first layer 340 epitaxially on the second layer 342, and then the supply of indium is stopped to grow the second layer 342 epitaxially on the first layer 340. By repeating the process, it is possible to form the light emitting layer 34.

Then, as shown in FIG. 6, the second semiconductor layer 36 is grown epitaxially on the light emitting layer 34. As the method of epitaxially growing the layers, there can be cited, for example, the MBE method. According to the process described hereinabove, it is possible to form the plurality of columnar parts 30 on the substrate 10.

As shown in FIG. 1, the insulating layer 40 is formed between the columnar parts 30 adjacent to each other. The insulating layer 40 is formed using, for example, the MOCVD method or a spin-coating method.

Then, the first electrode 50 is formed on the buffer layer 22, and the second electrode 52 is formed on the second semiconductor layer 36. The first electrode 50 and the second electrode 52 are formed using, for example, a vacuum deposition method. It should be noted that the order of forming the first electrode 50 and the second electrode 52 is not particularly limited.

According to the process described hereinabove, it is possible to manufacture the light emitting device 100.

1.3. Modified Example

Figure 7:
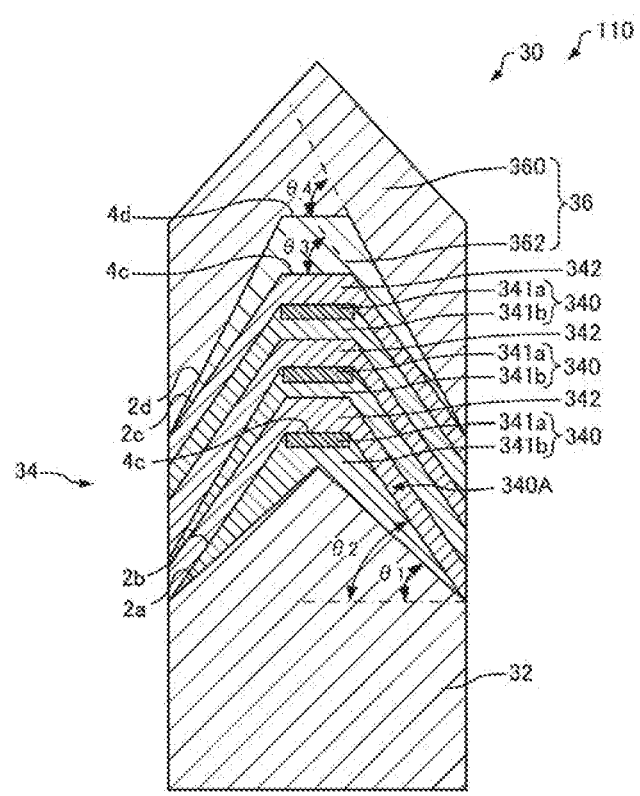
FIG. 7 is a cross-sectional view schematically showing a columnar part of a light emitting device according to a modified example of the first embodiment.

Then, a light emitting device according to a modified example of the first embodiment will be described with reference to the drawings. FIG. 7 is a cross-sectional view schematically showing the columnar part 30 of a light emitting device 110 according to the modified example of the first embodiment. Hereinafter, in the light emitting device 110 according to the modified example of the first embodiment, the members having substantially the same functions as those of the constituent members of the light emitting device 100 according to the first embodiment described above will be denoted by the same reference symbols, and detailed descriptions thereof will be omitted.

As shown in FIG. 2, in the light emitting device 100 described above, in the plan view viewed from the stacking direction, the c-plane 4c of the light emitting layer 34 is larger than the facet planes 2c of the light emitting layer 34.

In contrast, in the light emitting device 110, in the plan view viewed from the stacking direction, the c-plane 4c of the light emitting layer 34 is smaller than the facet planes 2c of the light emitting layer 34 as shown in FIG. 7.

Further, in the light emitting device 110, the first semiconductor layer 32 does not have the c-plane. In other words, the tip of the first semiconductor layer 32 is formed only of the facet planes 2a.

In the light emitting device 110, similarly to the light emitting device 100, θ2>θ1 is fulfilled, and θ4>θ3 is fulfilled. Therefore, in the light emitting device 110, it is possible to relax the electrical field concentration in the light emitting layer 34 similarly to the light emitting device 100.

2. Second Embodiment

2.1. Light Emitting Device

Figure 8:
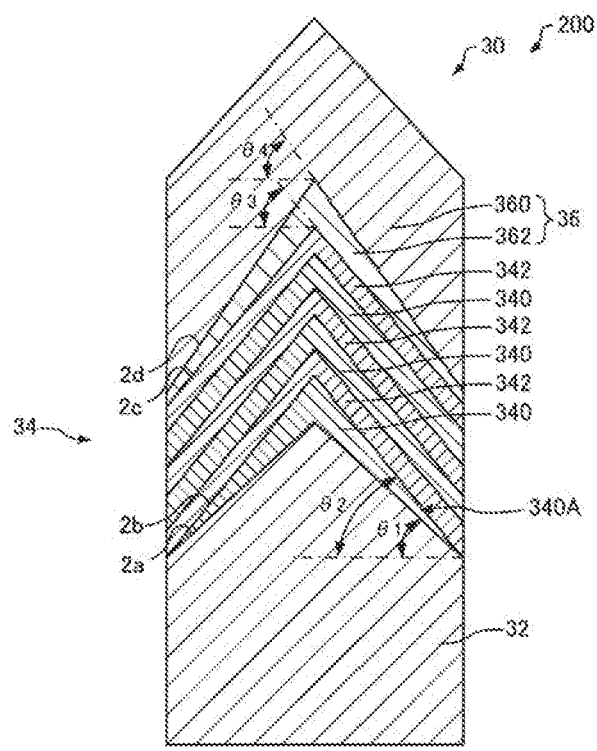
FIG. 8 is a cross-sectional view schematically showing a columnar part of a light emitting device according to a second embodiment.

Then, a light emitting device according to a second embodiment will be described with reference to the drawings. FIG. 8 is a cross-sectional view schematically showing the columnar part 30 of the light emitting device 200 according to the second embodiment. Hereinafter, in the light emitting device 200 according to the second embodiment, the members having substantially the same functions as those of the constituent members of the light emitting device 100 according to the first embodiment described above will be denoted by the same reference symbols, and detailed descriptions thereof will be omitted.

As shown in FIG. 2, in the light emitting device 100 described above, the first semiconductor layer 32, the light emitting layer 34, and the fourth semiconductor layer 362 each have the c-plane. In contrast, as shown in FIG. 8, in the light emitting device 200, the first semiconductor layer 32, the light emitting layer 34, and the fourth semiconductor layer 362 do not have the c-plane.

The tip of the first semiconductor layer 32 is formed only of, for example, the facet planes 2a. The tip of the light emitting layer 34 is formed only of, for example, the facet planes 2c. The fourth semiconductor layer 362 is formed only of, for example, the facet planes 2d.

Although the first layer 340 of the light emitting layer 34 does not have the first portion 341a and the second portion 341b shown in FIG. 2 in the example shown in FIG. 8, it is also possible for the first layer 340 to have the first portion 341a and the second portion 341b similarly to the example shown in FIG. 2.

In the light emitting device 200, similarly to the light emitting device 100, θ2>θ1 is fulfilled, and θ4>θ3 is fulfilled. Therefore, in the light emitting device 200, it is possible to relax the electrical field concentration in the light emitting layer 34 similarly to the light emitting device 100.

2.2. Method of Manufacturing Light Emitting Device

Then, a method of manufacturing the light emitting device 200 will be described. The method of manufacturing the light emitting device 200 is substantially the same as the method of manufacturing the light emitting device 100 described above except the point that the amounts of gallium and nitrogen supplied and the growth temperature are controlled so as not to form the c-planes when epitaxially growing the first semiconductor layer 32, the light emitting layer 34, and the second semiconductor layer 36. Therefore, the descriptions thereof will be omitted.

3. Third Embodiment

Figure 9:
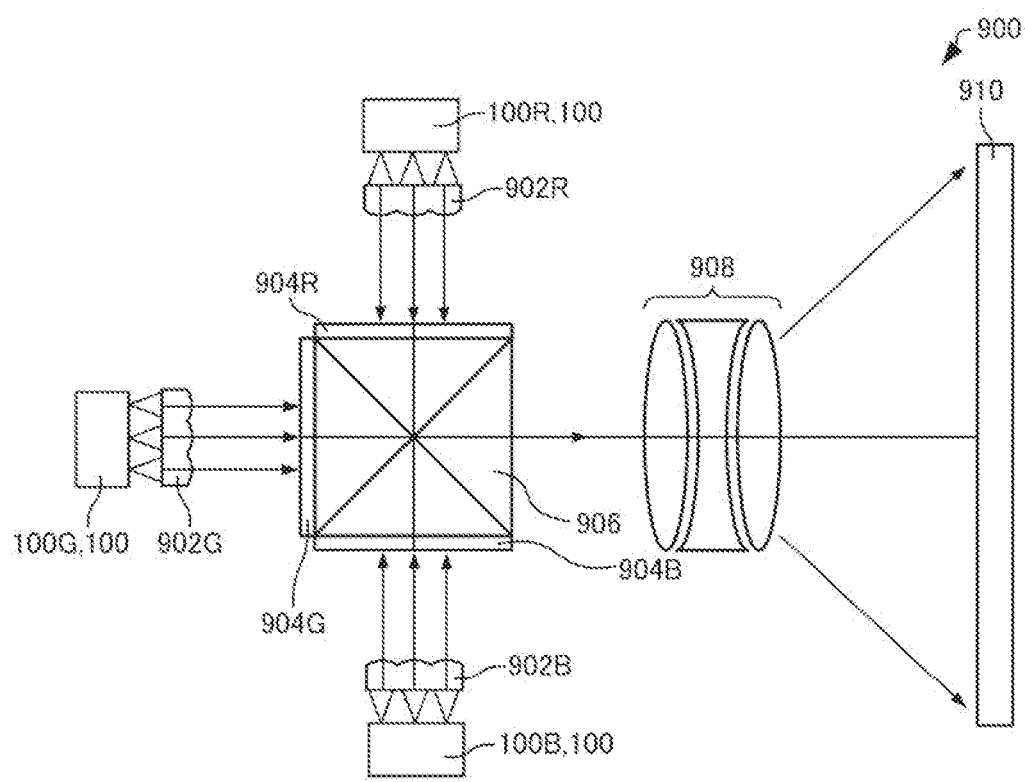
FIG. 9 is a diagram schematically showing a projector according to a third embodiment.

Then, a projector according to a third embodiment will be described with reference to the drawings. FIG. 9 is a diagram schematically showing the projector 900 according to the third embodiment.

The projector according to the present disclosure includes the light emitting device according to the present disclosure. Hereinafter, the projector 900 including the light emitting device 100 as the light emitting device according to the present disclosure will be described.

The projector 900 includes a housing not shown, a red light source 100R, a green light source 100G, and a blue light source 100B disposed inside the housing and for respectively emitting red light, green light, and blue light. Each of the red light source 100R, the green light source 100G and the blue light source 100B has, for example, a plurality of light emitting devices 100 arranged in an array in a direction perpendicular to the stacking direction, wherein a common substrate is used in common in the plurality of light emitting devices 100 as the respective substrates 10. The number of the light emitting devices 100 constituting each of the red light source 100R, the green light source 100G, and the blue light source 100B is not particularly limited. It should be noted that in FIG. 9, the red light source 100R, the green light source 100G, and the blue light source 100B are simplified for the sake of convenience.

The projector 900 further includes a first lens array 902R, a second lens array 902G, a third lens array 902B, a first light modulation device 904R, a second light modulation device 904G, the third light modulation device 904B, and a projection device 908 all disposed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first lens array 902R. The light emitted from the red light source 100R can be collected and, for example, superimposed with each other by the first lens array 902R.

The light collected by the first lens array 902R enters the first light modulation device 904R. The first light modulation device 904R modulates the incident light in accordance with image information. Then, the projection device 908 projects the image formed by the first light modulation device 904R on a screen 910 in an enlarged manner.

The light emitted from the green light source 100G enters the second lens array 902G. The light emitted from the green light source 100G can be collected and, for example, superimposed with each other by the second lens array 902G.

The light collected by the second lens array 902G enters the second light modulation device 904G. The second light modulation device 904G modulates the incident light in accordance with the image information. Then, the projection device 908 projects the image formed by the second light modulation device 904G on the screen 910 in an enlarged manner.

The light emitted from the blue light source 100B enters the third lens array 902B. The light emitted from the blue light source 100B can be collected and, for example, superimposed with each other by the third lens array 902B.

The light collected by the third lens array 902B enters the third light modulation device 904B. The third light modulation device 904B modulates the incident light in accordance with the image information. Then, the projection device 908 projects the image formed by the third light modulation device 904B on the screen 910 in an enlarged manner.

Further, the projector 900 may include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces so as to form a crisscross. The three colors of light are combined with each other by these dielectric multilayer films, and thus, the light representing a color image is formed. Then, the light thus combined is projected on the screen 910 by the projection device 908, and thus an enlarged image is displayed.

It should be noted that it is possible for the red light source 100R, the green light source 100G, and the blue light source 100B to directly form an image without using the first light modulation device 904R, the second light modulation device 904G, and the light modulation device 904B by controlling the light emitting devices 100 as the pixels of the image in accordance with the image information. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting device according to the present disclosure is not limited to the application of the embodiment described above, but can be used in other applications than the projector. As the applications other than the projector, there can be cited, for example, indoor and outdoor illumination, a backlight for a display, a laser printer, a scanner, an in-car light, sensing equipment using light and a light source of communication equipment and so on.

The present disclosure can be implemented with some of the constituents omitted, or combining any of the embodiments and the modified examples with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration denotes a configuration substantially the same in, for example, function, way and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages, or configurations capable of achieving the same object as the configuration explained in the description of the embodiments. Further, the present disclosure includes configurations obtained by adding a known technology to the configuration explained in the description of the embodiments.

What is claimed is:

1. A light emitting device comprising:
a substrate; and
a laminated structure provided to the substrate, and including a plurality of columnar parts, wherein
the columnar part includes
a first semiconductor layer,
a second semiconductor layer different in conductivity type from the first semiconductor layer, and
a light emitting layer disposed between the first semiconductor layer and the second semiconductor layer,
the first semiconductor layer is disposed between the substrate and the light emitting layer,
the second semiconductor layer includes
a third semiconductor layer, and
a fourth semiconductor layer lower in impurity concentration than the third semiconductor layer,
the light emitting layer has a facet plane,
the fourth semiconductor layer has a facet plane,
the facet plane of the light emitting layer is provided with the fourth semiconductor layer, and
θ4>θ3, in which θ3 is a tilt angle of the facet plane of the light emitting layer with respect to a surface of the substrate provided with the laminated structure, and θ4 is a tilt angle of the facet plane of the fourth semiconductor layer provided to the facet plane of the light emitting layer with respect to the surface of the substrate.

2. The light emitting device according to claim 1, wherein
the light emitting layer has a c-plane, and
the fourth semiconductor layer has a c-plane.

3. The light emitting device according to claim 2, wherein
in a plan view viewed in a stacking direction of the laminated structure, the c-plane of the light emitting layer is larger than the facet plane of the light emitting layer.

4. The light emitting device according to claim 2, wherein
in a plan view viewed in a stacking direction of the laminated structure, the c-plane of the fourth semiconductor layer is larger than the facet plane of the fourth semiconductor layer.

5. A projector comprising:
The light emitting device according to claim 1.

* * * * *